US006831303B2

(12) United States Patent
Dry

(10) Patent No.: US 6,831,303 B2
(45) Date of Patent: *Dec. 14, 2004

(54) LIGHT EMITTING DIODE LIGHT SOURCE

(75) Inventor: Joel M. Dry, Winters, TX (US)

(73) Assignee: Optolum, INC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/430,732

(22) Filed: May 5, 2003

(65) Prior Publication Data

US 2004/0000677 A1 Jan. 1, 2004

Related U.S. Application Data

(63) Continuation of application No. 10/156,810, filed on May 29, 2002, now Pat. No. 6,573,536.

(51) Int. Cl.$^7$ .................................... H01L 33/00

(52) U.S. Cl. .......................... 257/88; 362/555; 362/294; 362/373

(58) Field of Search .......................... 257/88; 362/555, 362/294, 373

(56) References Cited

U.S. PATENT DOCUMENTS

| | | | | | |
|---|---|---|---|---|---|
| 5,861,703 | A | * | 1/1999 | Losinski | 310/330 |
| 5,890,794 | A | * | 4/1999 | Abtahi et al. | 362/294 |
| 6,274,924 | B1 | * | 8/2001 | Carey et al. | 257/676 |
| 6,411,046 | B1 | * | 6/2002 | Muthu | 315/309 |
| 6,573,536 | B1 | * | 6/2003 | Dry | 257/88 |
| 6,611,110 | B1 | * | 8/2003 | Fregoso | 315/224 |

* cited by examiner

*Primary Examiner*—David Nelms
*Assistant Examiner*—Tu-Tu Ho
(74) *Attorney, Agent, or Firm*—Donald J. Lenkszus

(57) ABSTRACT

A light source that utilizes light emitting diodes that emit white light is disclosed. The diodes are mounted on an elongate member having at least two surfaces upon which the light emitting diodes are mounted. The elongate member is thermally conductive and is utilized to cool the light emitting diodes. In the illustrative embodiment, the elongate member is a tubular member through which a heat transfer medium flows.

23 Claims, 2 Drawing Sheets

LIGHT EMITTING DIODE LIGHT SOURCE

RELATED APPLICATIONS

This application is a continuation of my application Ser. No. 10/156,810 filed May 29, 2002 now U.S. Pat. No. 6,573,536.

FIELD OF THE INVENTION

This invention pertains to lighting sources, in general, and to a lighting source that utilizes Light Emitting Diodes (LED's), in particular.

BACKGROUND OF THE INVENTION

LED's have many advantages as light sources. However, in the past LED's have found application only as specialized light sources such as for vehicle brake lights, and other vehicle related lighting, and recently as flashlights. In these prior applications, the LED's are typically mounted in a planar fashion in a single plane that is disposed so as to be perpendicular to the viewing area. Typically the LED planar array is not used to provide illumination, but to provide signaling.

Recent attempts to provide LED light sources as sources of illumination have been few, and generally unsatisfactory from a general lighting standpoint.

It is highly desirable to provide a light source utilizing LED's that provides sufficient light output so as to be used as a general lighting source rather than as a signaling source.

One problem that has limited the use of LED's to specialty signaling and limited general illumination sources is that LED's typically generate significant amounts of heat. The heat is such that unless the heat is dissipated, the LED internal temperature will rise causing degradation or destruction of the LED.

It is therefore further desirable to provide an LED light source that efficiently conducts heat away from the LED's.

SUMMARY OF THE INVENTION

In accordance with the principles of the invention, an improved light source is provided. The light source includes an elongate thermally conductive member having an outer surface. A plurality of light emitting diodes is carried on the elongate member outer surface. At least some of the light emitting diodes are disposed in a first plane and others of said light emitting diodes are disposed in a second plane not coextensive with the first plane. Electrical conductors are carried by the elongate thermally conductive member and are connected to the plurality of light emitting diodes to supply electrical power thereto. The elongate thermally conductive member conducts heat away from the light emitting diodes.

In accordance with one aspect of the invention, an illustrative embodiment of the invention utilizes light emitting diodes that emit white light. However, other embodiments of the invention may utilize light emitting diodes that are of different colors to produce monochromatic light or the colors may be chosen to produce white light or other colors.

In accordance with another aspect of the invention the elongate thermally conductive member transfers heat from the light emitting diodes to a medium within said elongate thermally conductive member. In the illustrative embodiment of the invention, the medium is air.

In accordance with another aspect of the invention, the elongate thermally conductive member has one or more fins to enhance heat transfer to the medium.

In accordance with another aspect of the invention the elongate thermally conductive member comprises a tube In one embodiment of the invention, the tube has a cross-section in the shape of a polygon. In another embodiment of the invention, the tube has a cross-section having flat portions.

In accordance with another embodiment of the invention, the elongate thermally conductive member comprises a channel.

In accordance with the principles of the invention, the elongate thermally conductive member may comprise an extrusion, and the extrusion can be highly thermally conductive material such as aluminum.

In one preferred embodiment of the invention the elongate thermally conductive member is a tubular member. The tubular member has a polygon cross-section. However, other embodiments my have a tubular member of triangular cross-section.

In one embodiment of the invention, a flexible circuit is carried on a surface of said elongate thermally conductive member; the flexible circuit includes the electrical conductors.

In another aspect of the invention, the flexible circuit comprises a plurality of apertures for receiving said plurality of light emitting diodes. Each of the light emitting diodes is disposed in a corresponding one of the apertures and affixed in thermally conductive contact with said elongate thermally conductive member.

The elongate thermally conductive member includes a thermal transfer media disposed therein in a flow channel.

At least one clip for mounting the elongate thermally conductive member in a fixture may be included.

BRIEF DESCRIPTION OF THE DRAWING

The invention will be better understood from a reading of the following detailed description of a preferred embodiment of the invention taken in conjunction with the drawing figures, in which like reference indications identify like elements, and in which.

DETAILED DESCRIPTION

Figure 2:
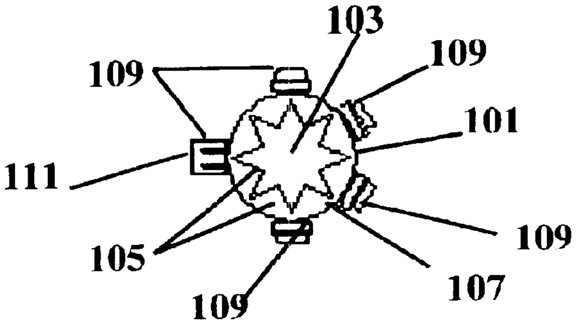
FIG. 2 is a top planar view of the light source of FIG. 1.
Figure 1:
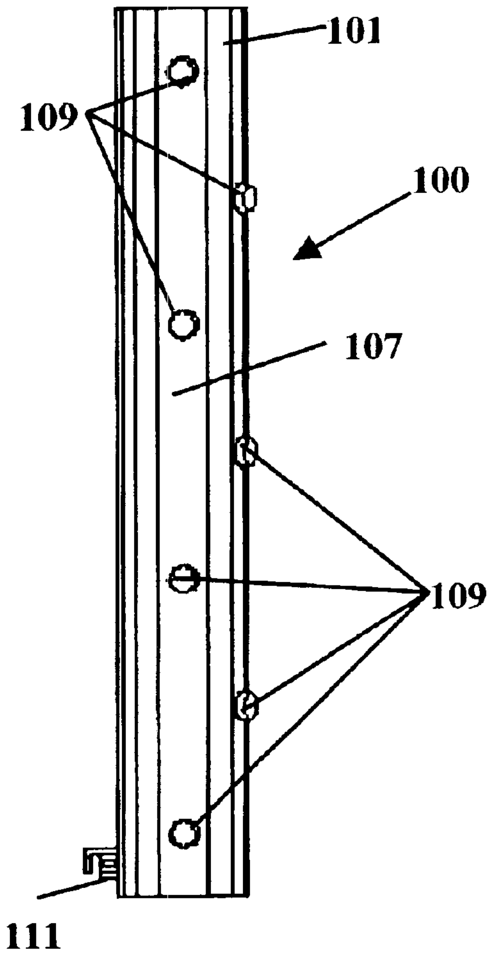
FIG. 1 is a planar side view of a light source in accordance with the principles of the invention.

A light source in accordance with the principles of the invention may be used as a decorative lighting element or may be utilized as a general illumination device. As shown in FIG. 1, a light source 100 in accordance with the invention includes an elongate thermally conductive member or heat sink 101. Elongate heat sink 101 is formed of a material that provides excellent thermal conductivity. Elongate heat sink 101 in the illustrative embodiment of the invention is a tubular aluminum extrusion. To improve the heat dissipative properties of light source 100, elongate heat sink 101 is configured to provide convective heat dissipation and cooling. As more clearly seen in FIG. 2, tubular heat sink 101 is hollow and has an interior cavity 103 that includes one or more heat dissipating fins 105. Fins 105 are shown as being triangular in shape, but may take on other shapes. Fins 105 are integrally formed on the interior of elongate heat sink 101. In the illustrative embodiment convective cooling is provided by movement of a medium 102 through elongate heat sink 101. The medium utilized in the illustrative embodiment is air, but may in some applications be a fluid other than air to provide for greater heat dissipation and cooling.

The exterior surface 107 of elongate heat sink 101 has a plurality of Light Emitting Diodes 109 disposed thereon. Each LED 109 in the illustrative embodiment comprises a white light emitting LED of a type that provides a high light output. Each LED 109 also generates significant amount of heat that must be dissipated to avoid thermal destruction of the LED. By combining a plurality of LEDs 109 on elongate heat sink 101, a high light output light source that may be used for general lighting is provided.

Figure 6:
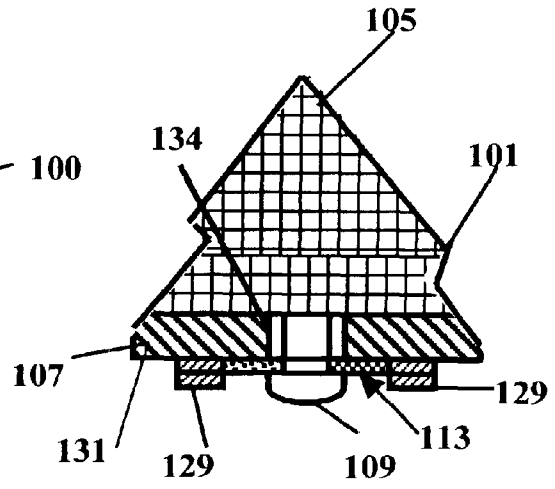
FIG. 6 is a partial cross-section of the light source of FIG. 1.

Conductive paths 129 are provided to connect LEDs 109 to an electrical connector 111. The conductive paths may be disposed on an electrically insulating layer 131 or layers disposed on exterior surface 107. In the illustrative embodiment shown in the drawing figures, the conductive paths and insulating layer are provided by means of one or more flexible printed circuits 113 that are permanently disposed on surface 107. As more easily seen in FIG. 6, printed circuit 113 includes an electrically insulating layer 131 that carries conductive paths 129. As will be appreciated by those skilled in the art, other means of providing the electrically conductive paths may be provided.

Flexible printed circuit 113 has LED's 109 mounted to it in a variety of orientations ranging from 360 degrees to 180 degrees and possibly others depending on the application. Electrical connector 111 is disposed at one end of printed circuit 113. Connector 113 is coupleable to a separate power supply to receive electrical current. Flexible printed circuit 113, in the illustrative embodiment is coated with a non-electrically conductive epoxy that may be infused with optically reflective materials. Flexible printed circuit 113 is adhered to the tube 101 with a heat conducting epoxy to aid in the transmission of the heat from LEDs 109 to tube 101. Flexible printed circuit 113 has mounting holes 134 for receiving LEDs 109 such that the backs of LEDs 109 are in thermal contact with the tube surface 107.

Tubular heat sink 101 in the illustrative embodiment is formed in the shape of a polygon and may have any number of sides. Although tubular heat sink 101 in the illustrative embodiment is extruded aluminum, tubular heat sink 101 may comprise other thermal conductive material. Fins 105 may vary in number and location depending on particular LED layouts and wattage. In some instances, fins may be added to the exterior surface of tubular heat sink 101. In addition, apertures may be added to the tubular heat sink to enhance heat flow.

Figure 3:
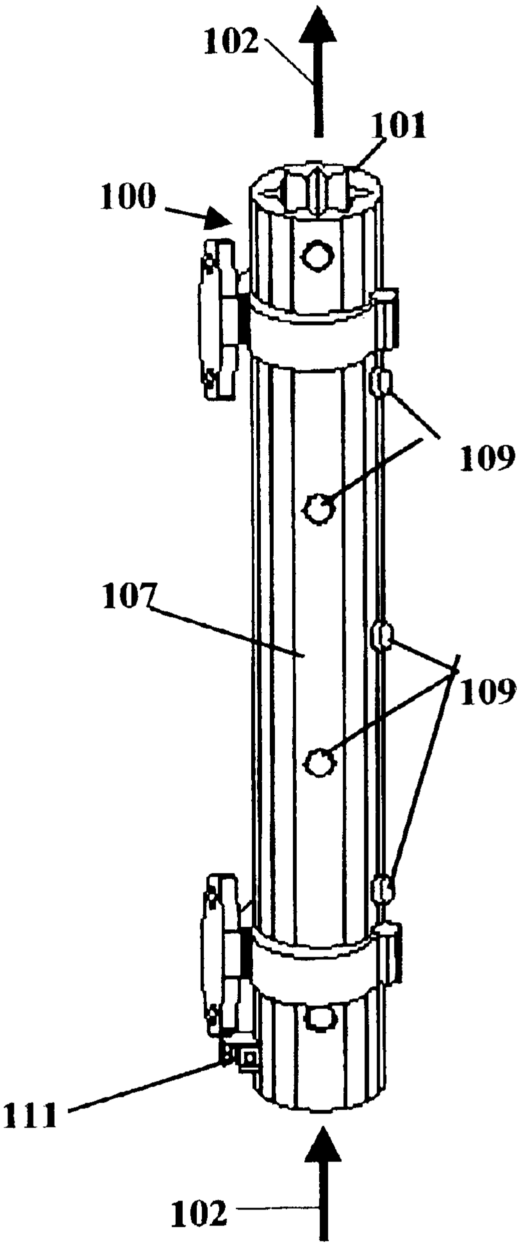
FIG. 3 is a perspective view of the light source of FIG. 1 with mounting clips.
Figure 5:
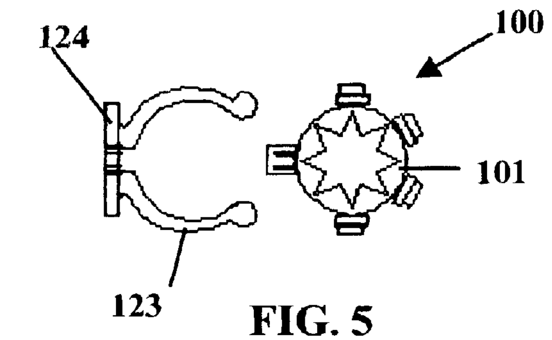
FIG. 5 is a top view of the light source and mounting clips of FIG. 4.
Figure 4:
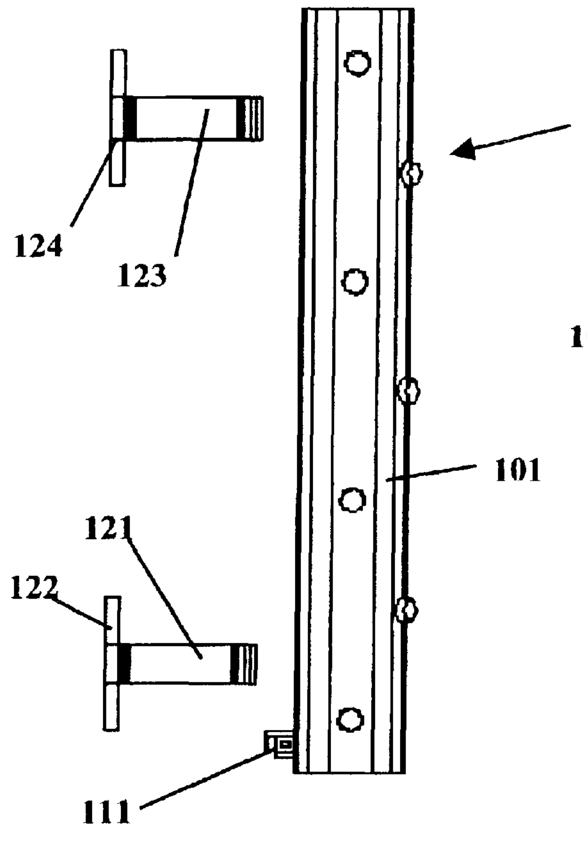
FIG. 4 is a planar side view of the light source of FIG. 3 showing mounting clips separated from the light source.

Light source 100 is mounted into a fixture and retained in position by mounting clips 121, 123 as most clearly seen in FIGS. 3, 4, and 5. Each of the clips is shaped so as to engage and retain light source 100. Each clip is affixed on one surface 122, 124 to a light fixture.

Although light source 100 is shown as comprising an elongate tubular heat sink, other extruded elongate members may be used such as channels.

In the illustrative embodiment shown, convection cooling by flow of air through tubular heat sink 101 is utilized such that cool or unheated air enters tubular heat sink 101 at its lower end and exits from the upper end as heated air. In higher wattage light sources, rather than utilizing air as the cooling medium, other fluids may be utilized. In particular, convective heat pumping may be used to remove heat from the interior of the heat sink.

In one particularly advantageous embodiment of the invention, the light source of the invention is configured to replace compact fluorescent lighting in decorative applications.

As will be appreciated by those skilled in the art, the principles of the invention are not limited to the use of light emitting diodes that emit white light. Different colored light emitting diodes may be used to produce monochromatic light or to produce light that is the combination of different colors.

Although the invention has been described in terms of illustrative embodiments, it is not intended that the invention be limited to the illustrative embodiments shown and described. It will be apparent to those skilled in the art that various changes and modifications may be made to the embodiments shown and described without departing from the spirit or scope of the invention. It is intended that the invention be limited only by the claims appended hereto.

What is claimed is:

1. A light source comprising:

an elongate thermally conductive member having an outer surface;

a plurality of light emitting diodes carried on said elongate member outer surface at least some of said light emitting diodes being disposed in a first plane and others of said light emitting diodes being disposed in a second plane not coextensive with said first plane;

electrical conductors carried by said elongate thermally conductive member and connected to said plurality of light emitting diodes to supply electrical power thereto; and said elongate thermally conductive member being configured to conduct heat away from said light emitting diodes to fluid contained by said elongate thermally conductive member;

said elongate thermally conductive member comprises one or more heat dissipation protrusions.

2. A light source in accordance with claim 1, wherein:

at least one of said heat dissipation protrusions being carried on said elongate member outer surface.

3. A light source in accordance with claim 2, wherein:

said elongate thermally conductive member is configured to conduct heat away from said light emitting diodes to fluid proximate said elongate member outer surface.

4. A light source in accordance with claim 3, wherein:

said fluid proximate said elongate member outer surface comprises air.

5. A light source in accordance with claim 4, wherein:

said fluid contained by said elongate thermally conductive member is a cooling medium other than air.

6. A light source in accordance with claim 3, wherein:

said elongate thermally conductive member comprises a tube.

7. A light source in accordance with claim 6, wherein:

said tube has a cross-section in the shape of a polygon.

8. A light source in accordance with claim 6, wherein:

said tube has a cross-section having flat portions.

9. A light source in accordance with claim 1, wherein:

said elongate thermally conductive member comprises a channel.

10. A light source in accordance with claim 3, wherein: said elongate thermally conductive member comprises an extrusion.

11. A light source in accordance with claim 10, wherein: said extrusion is an aluminum extrusion.

12. A light source in accordance with claim 10, wherein: said elongate thermally conductive member is a tubular member.

13. A light source in accordance with claim 12, wherein: said tubular member has a polygon cross-section.

14. A light source in accordance with claim 1, wherein: said fluid is moved in said elongate thermally conductive member.

15. A light source in accordance with claim 1, wherein: said elongate thermally conductive member comprises a thermal transfer media disposed therein.

16. A light source in accordance with claim 15, wherein: said elongate thermally conductive member comprises a flow channel for said thermal transfer media.

17. A light source in accordance with claim 1, wherein: each of said light emitting diodes emits white light.

18. A light source in accordance with claim 1, wherein: at least some of said light emitting diodes emit colored light.

19. A light source comprising:

an elongate thermally conductive member having an outer surface;

at least one light emitting diode carried on said elongate member outer surface;

one or more electrical conductors carried by said elongate thermally conductive member and connected to said at least one light emitting diode to supply electrical power thereto;

said elongate thermally conductive member being configured to conduct heat away from said at least one light emitting diode to fluid contained by said elongate thermally conductive member; and said elongate thermally conductive member comprises one or more heat dissipation protrusions.

20. A light source comprising:

an elongate thermally conductive member having an outer surface;

at least one light emitting diode carried on said elongate member outer surface;

one or more electrical conductors carried by said elongate thermally conductive member and connected to said at least one light emitting diode to supply electrical power thereto;

said elongate thermally conductive member being configured to conduct heat away from said at least one light emitting diode to fluid contained by said elongate thermally conductive member; and said fluid is moved in said elongate thermally conductive member.

21. A light source comprising:

an elongate thermally conductive member having an outer surface;

a plurality of light emitting diodes carried on said elongate member outer surface at least some of said light emitting diodes being disposed in a first plane and others of said light emitting diodes being disposed in a second plane not coextensive with said first plane;

electrical conductors carried by said elongate thermally conductive member and connected to said plurality of light emitting diodes to supply electrical power thereto; and said elongate thermally conductive member being configured to conduct heat away from said light emitting diodes to fluid contained by said elongate thermally conductive member; and said fluid is moved in said elongate thermally conductive member.

22. A light source comprising:

an elongate thermally conductive member having an outer surface;

a plurality of light emitting diodes carried on said elongate member outer surface at least some of said light emitting diodes being disposed in a first plane and others of said light emitting diodes being disposed in a second plane not coextensive with said first plane;

electrical conductors carried by said elongate thermally conductive member and connected to said plurality of light emitting diodes to supply electrical power thereto; and said elongate thermally conductive member being configured to conduct heat away from said light emitting diodes to fluid contained by said elongate thermally conductive member; and a coating carried on said elongate thermally conductive member.

23. A light source in accordance with claim 22, wherein: said coating is infused with optically reflective material.

* * * * *